(12) United States Patent
Teng

(10) Patent No.: US 8,252,513 B2
(45) Date of Patent: *Aug. 28, 2012

(54) METHOD FOR ON-PRESS DEVELOPING LASER SENSITIVE LITHOGRAPHIC PRINTING PLATE

(76) Inventor: Gary Ganghui Teng, Northborough, MA (US)

(*) Notice: Subject to any disclaimer, the term of this patent is extended or adjusted under 35 U.S.C. 154(b) by 731 days.

This patent is subject to a terminal disclaimer.

(21) Appl. No.: 12/267,551

(22) Filed: Nov. 7, 2008

(65) Prior Publication Data

US 2009/0061363 A1 Mar. 5, 2009

Related U.S. Application Data

(63) Continuation-in-part of application No. 12/127,806, filed on May 27, 2008, now Pat. No. 8,062,832, and a continuation-in-part of application No. 12/126,899, filed on May 25, 2008, now Pat. No. 8,053,170, and a continuation-in-part of application No. 11/645,376, filed on Dec. 26, 2006, now abandoned, which is a continuation-in-part of application No. 11/057,663, filed on Feb. 14, 2005, now Pat. No. 7,427,465.

(51) Int. Cl.
*G03F 7/00* (2006.01)
*G03F 7/26* (2006.01)
*B41F 7/00* (2006.01)

(52) U.S. Cl. ............ 430/302; 101/450.1; 101/453; 101/463.1

(58) Field of Classification Search .......... 101/450.1, 101/453, 463.1; 430/302
See application file for complete search history.

(56) References Cited

U.S. PATENT DOCUMENTS

| | | | |
|---|---|---|---|
| 5,258,263 A | 11/1993 | Cheema et al. | 101/456 |
| 5,422,204 A | 6/1995 | Yoshinaga et al. | 430/2 |
| 5,599,650 A | 2/1997 | Bi et al. | 430/273.1 |
| 5,607,816 A | 3/1997 | Fitzgerald et al. | 430/271.1 |
| 5,616,449 A | 4/1997 | Cheng et al. | 430/302 |
| 5,677,108 A | 10/1997 | Chia et al. | 430/273.1 |
| 5,910,395 A | 6/1999 | Li et al. | 430/302 |
| 6,014,929 A | 1/2000 | Teng | 101/456 |
| 6,136,503 A | 10/2000 | Zheng et al. | 430/270.1 |
| 6,153,356 A | 11/2000 | Urano et al. | 430/281.1 |
| 6,232,038 B1 | 5/2001 | Takasaki et al. | 430/281.1 |
| 6,309,792 B1 | 10/2001 | Hauck et al. | 430/270.1 |
| 6,331,375 B1 | 12/2001 | Kawamura et al. | 430/270.1 |
| 6,387,595 B1 * | 5/2002 | Teng | 430/302 |
| 6,482,571 B1 | 11/2002 | Teng | 430/302 |
| 6,576,401 B2 | 6/2003 | Teng | 430/303 |
| 6,689,537 B2 | 2/2004 | Urano et al. | 430/273.1 |
| 6,740,464 B2 | 5/2004 | Maemoto | 430/138 |
| 2003/0186165 A1 | 10/2003 | Gries et al. | 430/281.1 |
| 2004/0038152 A1* | 2/2004 | Goodin et al. | 430/302 |
| 2006/0183049 A1* | 8/2006 | Teng | 430/270.1 |

FOREIGN PATENT DOCUMENTS

JP 2004295024 A * 10/2004

* cited by examiner

*Primary Examiner* — Cynthia Kelly
*Assistant Examiner* — Chanceity Robinson

(57) ABSTRACT

A method of on-press developing a high-speed laser sensitive lithographic printing plate with ink and/or fountain solution is described. The plate comprises on a substrate a photosensitive layer soluble or dispersible in ink and/or fountain solution and capable of hardening upon exposure to a laser. The plate is exposed with a laser and on-press developed with ink and/or fountain solution. At least a portion of the on-press development is performed with the plate under a yellow-red light, in substantial darkness, or under a light that is different from the light for printing and does not cause hardening of the photosensitive layer during on-press development.

17 Claims, No Drawings

METHOD FOR ON-PRESS DEVELOPING LASER SENSITIVE LITHOGRAPHIC PRINTING PLATE

RELATED PATENT APPLICATIONS

This application is a continuation-in-part of application Ser. No. 12/127,806 filed May 27, 2008 now U.S. Pat. No. 8,062,832, a continuation-in-part of application Ser. No. 12/126,899 filed May 25, 2008 now U.S. Pat. No. 8,053,170, and a continuation-in-part of application Ser. No. 11/645,376 filed Dec. 26, 2006 now abandoned, which is a continuation-in-part of application Ser. No. 11/057,663 filed Feb. 14, 2005 now U.S. Pat. No. 7,427,465.

FIELD OF THE INVENTION

This invention relates to lithographic printing plates. More particularly, it relates to on-press ink and/or fountain solution development of high-speed laser sensitive lithographic plates having on a substrate a photosensitive layer that has limited stability in ambient room light.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616, 449, 5,677,110, 5,811,220, 6,014,929, 6,071,675, and 6,482, 571.

Conventionally, the plate is exposed with an actinic light (usually an ultraviolet light from a lamp) through a separate photomask film having predetermined image pattern that is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This allows the elimination of the photomask film, reducing material, equipment and labor cost. Suitable lasers include infrared lasers (such as laser diode of about 830 nm and NdYAG laser of about 1064 nm), visible lasers (such as frequency-doubled NdYAG laser of about 532 nm, violet laser diode of about 390430 nm), and ultraviolet laser (such as ultraviolet laser diode of about 350 to 370 nm). Among them, infrared laser diode, violet laser diode, and ultraviolet laser diode are most attractive. Infrared laser sensitive plates have the advantage of relative white or yellow light stability, violet laser sensitive plates have the advantage of low imager cost due to the low cost of the violet laser diode which is made in mass production for DVD, and ultraviolet laser sensitive plates have the advantage of higher sensitivity (requiring less laser dosage) than longer wavelength lasers.

Laser sensitive plates generally have higher sensitivity (than conventional plate requiring photomask film) because of the limited laser power and the desire for fast imaging speed. Accordingly, photosensitive plates designed for laser imaging generally have limited room light stability. For example, before being developed to remove the non-hardened areas, frequency-doubled NdYAG laser sensitive plates usually require red room light for handling, violet laser sensitive plates usually require orange or yellow room light for handling, and infrared laser sensitive photopolymer plates usually require yellow room light for handling and have only limited white light stability (due to, for example, the use of certain initiator which has spectral sensitivity in the ultraviolet region).

Such limited room light stability is an inherent barrier for the design and use of on-press developable laser sensitive lithographic plate because the pressrooms are generally equipped with white lights, in addition to the difficulties in designing any on-press developable plate with good press performance (including on-press developable plate requiring photomask film). Despite of such difficulties, there is a strong desire to develop a high speed laser sensitive on-press developable lithographic plate as well as methods of using it because of its environmental and economic benefits.

SUMMARY OF THE INVENTION

According to the present invention, there has been provided a method of lithographically printing images on a receiving medium, comprising in order:
(a) providing a lithographic printing plate comprising (i) a substrate; and (ii) a photosensitive layer soluble or dispersible in ink and/or fountain solution and capable of hardening upon exposure to a laser having a wavelength selected from 200 to 1200 nm;
(b) imagewise exposing said plate with said laser to cause hardening of the photosensitive layer in the exposed areas;
(c) developing said plate with ink and/or fountain solution on a lithographic press to remove the non-hardened areas of the photosensitive layer; and
(d) lithographically printing images from said plate to the receiving medium;
(e) wherein at least a portion of the on-press development (step c) is performed with the plate under a yellow-red light, under a light that contains substantially no radiation below a wavelength selected from 400 to 650 nm, in substantial darkness, under a light that is different from the light for said step (d) and incapable of causing hardening of the photosensitive layer in the non-hardened areas during the time length of said step (c), or under a white light with intensity lower than the intensity of the light for said step (d) and incapable of causing hardening of the photosensitive layer in the non-hardened areas during the time length of said step (c).

Preferably at least 90% (in terms of time) of said on-press development (step c) is performed with the plate under a yellow-red light; and at least a portion (in terms of time), preferably at least 90%, of said lithographic printing (step d) is performed with the plate under white light or under a lighting with substantial radiation below a wavelength selected from 400 to 650 nm. More preferably, at least 99% of said on-press development is performed with the plate under a yellow-red light and at least 99% of said lithographic printing is performed with the plate under white light. Most preferably all said on-press development is performed with the plate under a yellow-red light, and all said lithographic printing is performed with the plate under white light.

The controlled lighting (including yellow-red light) allows handling and on-press developing the plate without causing undesirable hardening in the laser-non-exposed areas, and the yellow-red light or other controlled visible light also allows the operator to handle the plate and operate the machines before and during on-press development with reasonable lighting (although not full lighting); while the white light (under regular intensity for room lighting) during printing allows the operator to inspect the printed sheets under normal lighting.

According to another aspect of the current invention, the above on-press development (step c) and lithographic printing (step d) are performed in a pressroom having a yellow-red light source and a white light source; the yellow-red light source is on and the white light source is off during at least a portion (in terms of time) of step (c), and the white light source is on (with the yellow-red light source off or on, preferably off) during at least a portion (in terms of time) of step (d). Preferably, the yellow-red light source is on and the white light source is off during at least 90%, more preferably at least 99%, and most preferably all of step (c), and the white light source is on during at least 90%, more preferably at least 99%, and most preferably all of step (d). Further preferably, the yellow-red light source is turned on and the white light source is turned off at or before the start of step (c), and the white light source is then turned on (with or without the yellow-red light source being turned off) around the end of step (c).

According to a third aspect of the current invention, the above imagewise exposure is performed on an exposure device (also called imager), and the above exposure device and lithographic press are in a pressroom having a yellow-red light source and a white light source; the yellow-red light source is on and the white light source is off during at least a portion of the imagewise exposure (step b) and on-press development (step c), and the white light source is on (with the yellow-red light source off or on, preferably off) during at least a portion of the lithographic printing (step d). Preferably, the yellow-red light source is on and the white light source is off during at least 90%, more preferably at least 99%, and most preferably all of steps (b) and (c), and the white light source is on during at least 90%, more preferably at least 99%, and most preferably all of step (d). Further preferably, the yellow-red light source is turned on and the white light source is turned off at or before the start of step (b), and the white light source is then turned on (with or without the yellow-red light source being turned off) around the end of step (c).

According to a fourth aspect of the current invention, the above plate is exposed with said laser while mounted on the lithographic press, and the press is in a pressroom having a yellow-red light source and a white light source; the yellow-red light source is on and the white light source is off during at least a portion of the imagewise exposure (step b) and on-press development (step c), and the white light source is on (with the yellow-red light source off or on, preferably off) during at least a portion of the lithographic printing (step d). Preferably, the yellow-red light source is on and the white light source is off during at least 90%, more preferably at least 99%, and most preferably all of steps (b) and (c), and the white light source is on during at least 90%, more preferably at least 99%, and most preferably all of step (d). Further preferably, the yellow-red light source is turned on and the white light source is turned off before mounting the plate on press (a step before step b), and the white light source is then turned on (with or without the yellow-red light source being turned off) around the end of on-press development (step c).

According to a fifth aspect of the present invention, the above plate is exposed with said laser on a laser imager; said imager is connected to a plate cassette for feeding the plate to the imager and is also connected to a plate collector for collecting the exposed plate; said imager, cassette and collector are shielded with covers so that no or substantially no room light or the below-450 nm portion of the room light reaches the plate while the plate is in the cassette, imager or collector, or during the transportation from the cassette to the imager or from the imager to the collector; and the exposed plate is picked up from the collector to mount to said lithographic press for said on-press development and lithographic printing. Here said imager and press are in a pressroom having a yellow-red light source and a white light source; said yellow-red light source is on and said white light source is off in said pressroom when a portion of said covers is opened, when the exposed plate is picked up from the collector to mount to said press, or during at least a portion (preferably substantially all) of said on-press development; and said white light source is on (with the yellow light source off or on) during at least a portion (preferably substantially all) of said lithographic printing.

According to a sixth aspect of the present invention, the above plate is exposed on a laser imager in an imager room, the exposed plate is placed in a light-tight box to transport to a pressroom, and the exposed plate is then picked up from said box to mount to said lithographic press for said on-press development and lithographic printing. Here said imager is in a room (imager room) having a yellow-red light source (with or without a white light source), and said press is in another room (pressroom) having a yellow-red light source and a white light source; said yellow-red light source in said pressroom is on and said white light source in said pressroom is off when the plate is picked up from said box to mount to said press, or during at least a portion (preferably substantially all) of said on-press development; and said white light source in said pressroom is on (with the yellow light off or on) during at least a portion (preferably substantially all) of the lithographic printing. Said imager room preferably has said yellow-red light source on without any white light source on when said plate is placed into said light-tight box.

According to a seventh aspect of the present invention, the above plate is exposed with said laser on a laser imager in an imager room, the exposed plate is transferred (preferably automatically) through a light-tight passage from the imager room into a light-tight box which is located fully or partially in a pressroom, and the exposed plate is then picked up from the box in the pressroom to mount to said lithographic press for said on-press development and lithographic printing. Here said imager is in a room (imager room) having a yellow-red light source (with or without a white light source), and said press is in another room (pressroom) having a yellow-red light source and a white light source; said yellow-red light source in said pressroom is on and said white light source in said pressroom is off when the plate is picked up from the box to mount to said press and during at least a portion (preferably substantially all) of said on-press development; and said white light source in said pressroom is on (with the yellow light source off or on) during at least a portion (preferably substantially all) of the lithographic printing.

According to an eighth aspect of the present invention, at least a portion (preferably at least 90%, more preferably at least 99% and most preferably all) of said on-press development (step c) is performed with the plate under a first light that does not cause hardening of the photosensitive layer or background toning of the substrate in the non-hardened areas during the time period of said step (c); and at least a portion (preferably at least 90%, more preferably at least 99% and most preferably all) of said lithographic printing (step d) is performed with the plate under a second light that is capable of causing hardening of the photosensitive layer or background toning of the substrate in the non-hardened areas of said plate before development; said first light and second light being different in intensity and/or wavelength range. Preferably, the first light is a yellow-red light, or a weaker white light (with intensity lower than the second white light), more preferably a yellow-red light, and the second light is a white light.

The laser used in this invention can be any laser with a wavelength selected from 200 to 1200 nm (including ultraviolet, visible, or infrared laser) which is capable of causing hardening of the photosensitive layer, preferably an infrared laser (750 to 1200 nm) or a violet or ultraviolet laser (200 to 430 μm). The plate can be imagewise exposed with a laser on a plate exposure device and then transferred to a lithographic press for on-press development with ink and/or fountain solution by rotating the plate cylinder and engaging ink and/or fountain solution roller; the developed plate can then directly print images on said press to the receiving sheets (such as paper). Alternatively, the plate can be imagewise exposed with the laser on a lithographic press, on-press developed on said press with ink and/or fountain solution, and then directly print inked images on said press to the receiving sheets.

DETAILED DESCRIPTION OF THE PREFERRED EMBODIMENTS

The term yellow-red light means a yellow light, a red light, or any light with color between yellow and red, such as an orange light; the yellow-red light preferably contains no substantial radiation with wavelengths below a wavelength selected from 400 to 650 nm. Suitable yellow-red light includes a light that is from a fluorescent or incandescent lamp that is covered with a filter that cuts off substantially all (preferably all) of the radiation below a wavelength selected from 400 to 650 nm. Such a cut off wavelength can be 400, 450, 500, 550, 600 or 650 nm, or any wavelength between 400 and 650 nm, depending on the spectral sensitivity of the plate. Preferably, the yellow-red light contains no substantial radiation below 450 nm, more preferably no substantial radiation below 500 nm, and most preferably no substantial radiation below 530 nm. Various yellow-red lamps are commercially available (such as from EncapSulite International Inc. and General Electric), and can be used for the instant invention.

The white light can be a regular fluorescent light, a regular incandescent light, sunlight, any regular office light, or any light with broad spectrum over at least the whole visible region (about 380 to 750 nm). A white light (such as from an office fluorescent lamp) with addition of a yellow-red light (such as from a yellow light lamp) is also considered a white light in this application, because such light has broad spectrum over the whole visible region. Preferred white light is a regular fluorescent light and regular incandescent light, with or without addition of sunlight from the windows. More preferred white light is a regular fluorescent light.

In this invention, the term "substantial darkness" or "no substantial radiation" means a lighting (including darkness) with lower than 1% of the light intensity for all wavelengths for a 100-watt regular tungsten incandescent lamp (also called tungsten lamp or incandescent lamp) at a distance of 2 meters. The term "substantially no radiation below a wavelength" means the intensity of the radiation below that wavelength is lower than 1% of the radiation below that wavelength for a 100-watt tungsten lamp at 2 meters. The term "substantial radiation" means the light intensity is higher than 1% of the radiation for a 100-watt tungsten lamp at 2 meters. The term "substantial radiation for certain wavelengths" means the light intensity for such wavelengths is higher than 1% of a 10-watt tungsten lamp at 2 meters for such wavelengths. The term "substantially light-tight" means that less than 1% of light can pass through. The term "substantially all" or "substantially the entire" means at least 99% of all.

It is noted that a yellow-red light source can consist of one or more yellow-red light lamps (such as six 40-watt fluorescent lamps with orange covers installed on the pressroom ceiling controlled with a switch), and a white light source can consist of one or more white light lamps (such as eight 40-watt regular fluorescent lamps installed on the pressroom ceiling controlled with a switch).

The imager room or pressroom has no or only limited openings to outside so that no or only limited light enters the pressroom, during the operations which require that the regular white light source be turned off. The opening can be transparent to all light or only transparent to a yellow-red light (such as with yellow-red glass), preferably only transparent to yellow-red light. Preferably less than 1% of any light, or of the light with wavelengths below a wavelength selected from 400 to 650 nm, enters the pressroom from outside. The imager room or pressroom is in substantial darkness, under a weak yellow-red lighting (such as from a yellow-red filtering window), or under a lighting that is at least 10 times (preferably at least 100 times) weaker than normal office lighting, more preferably in substantial darkness and most preferably in darkness, when both the yellow-red light source and the white light source are off during typical operations of this invention. The lighting of the room with both yellow-red and white light sources off should be sufficiently weak, preferably the room is substantially dark and more preferably completely dark, so that it does not cause hardening of the photosensitive layer of a non-covered plate within at least 30 minutes, more preferably within at least 60 minutes and or most preferably for any length of time. Depending on the sensitivity of the plate, the dimness of the room when all the light sources are off can be different.

The imager room or pressroom preferably has one or more closed windows or shields which are non-transparent and may be opened to allow outside light or both outside light and outside air in. Such window or shield is generally closed, and may be opened during the lithographic printing or when it is safe to turn on the white light source (such as when all non-developed plates are fully shielded with covers in an imager, cassette, collector, and/or box). The door of the imager room or pressroom is generally closed, and may be opened during the lithographic printing or when it is safe to turn on the white light source.

In a preferred embodiment of this invention, the laser exposed plate is on-press developed with ink and/or fountain solution, and then lithographically prints out inked images to the receiving medium (such as paper) in a pressroom having a yellow-red light source and a white light source; the yellow-red light source is on and the white light source is off during at least a portion (in terms of time) of the on-press development, and the white light source is on (with the yellow-red light off or on, preferably off) during at least a portion (in terms of time) of the lithographic printing. Preferably, the yellow-red light source is on and the white light source is off during at least 90%, more preferably at least 99%, and most preferably all (in terms of time) of the on-press development, and the white light source is on during at least 90%, more preferably at least 99%, and most preferably all (in terms of time) of the lithographic printing. Preferably, the pressroom is in substantial darkness when both the yellow-red light source and the white light source are off.

In another preferred embodiment of this invention, both the laser exposure device and the lithographic press are in a pressroom having a yellow-red light source and a white light source; the yellow-red light source is on and the white light source is off during at least a portion (in terms of time) of the laser exposure and on-press development, and the white light source is on (with the yellow-red light off or on, preferably off) during at least a portion (in terms of time) of the lithographic printing. Preferably, the yellow-red light source is on and the white light source is off during at least 90%, more preferably at least 99%, and most preferably all (in terms of time) of the laser exposure and on-press development, and the white light source is on during at least 90%, more preferably at least 99%, and most preferably all (in terms of time) of the lithographic printing.

In a third preferred embodiment of this invention, the plate is imagewise exposed with a laser on a lithographic press in a pressroom having a yellow-red light source and a white light source; the yellow-red light source is on and the white light source is off during at least a portion (in terms of time) of the laser exposure and on-press development, and the white light source is on (with the yellow-red light off or on, preferably off) during at least a portion (in terms of time) of the lithographic printing. Preferably, the yellow-red light source is on and the white light source is off during at least 90%, more preferably at least 99%, and most preferably all (in terms of time) of the laser exposure and on-press development, and the white light source is on during at least 90%, more preferably at least 99%, and most preferably all (in terms of time) of the lithographic printing.

In a fourth preferred embodiment of this invention, the lithographic press is in a pressroom having a yellow-red light source and a white light source; the yellow-red light source is turned on and the white light source is turned off at or before the start of the on-press development, and the white light source is then turned on (with or without the yellow-red light source being turned off) around the end of on-press development. Preferably, the yellow-red light source is turned off when the white light source is turned on.

In a fifth preferred embodiment of this invention, both the exposure device and the lithographic press are in a pressroom having a yellow-red light source and a white light source; the yellow-red light source is turned on and the white light source is turned off at or before the start of the laser exposure, and the white light source is then turned on (with or without the yellow-red light source being turned off) around the end of on-press development. Preferably, the yellow-red light source is turned off when the white light source is turned on.

In a sixth preferred embodiment of this invention, the lithographic press is in a pressroom having a yellow-red light source and a white light source; the yellow-red light source is on during all the operations of the press; and the white light source is turned off at or before the start of the on-press development, and is then turned on around the end of on-press development. Preferably, the white light source is turned off at or before the start of the laser exposure, if the laser exposure is also in the pressroom.

In a seventh preferred embodiment of this invention, the light sources are controlled at least from (i) the exposure device which is capable of automatically turning off the white light source, if it is on, and turning on the yellow-red light source, if it is off after setting up and until at least completing a laser exposure job; and (ii) the press which is capable of automatically turning on the white light source (with or without turning off the yellow-red light source, preferably with turning off the yellow light source) after starting the press (to rotate the cylinders) for 1 to 600 rotations of the plate cylinder or for 1 to 600 seconds. If the exposure device has a job in the queue, is exposing a plate, or has an exposed plate on it waiting to be removed, the light switching function of the press will postpone until the exposure device finishes the job and the exposed plate on the exposure device has been removed for 0 to 600 seconds. Preferably, the yellow-red light source is turned on and the white light source is turned off at or before the start of on-press development, and the white light source is turned on (with or without the yellow-red light source being turned off, preferably with the yellow-red light source being turned off) at the end of or during on-press development or during lithographic printing, more preferably around the end of on-press development.

In an eighth preferred embodiment of this invention, the plate is imagewise exposed on a press and then developed with ink and/or fountain solution on the same press, in a pressroom having a yellow-red light source and a white light source; and the light sources are controlled at least from the press which (i) is capable of automatically turning off the white light source, if it is on, and turning on the yellow-red light source, if it is off, after setting up a laser exposure job and until completing the laser exposure and then engaging the fountain roller and/or the ink roller to the plate cylinder for 1 to 600 rotations of the plate cylinder or for 1 to 600 seconds; and (ii) is capable of automatically turning on the white light source (with or without turning off the yellow-red light source, preferably with turning off the yellow-red light source) after starting the press (to rotate the cylinders) for 1 to 600 rotations of the plate cylinder or for 1 to 600 seconds. Preferably, the yellow-red light source is turned on and the white light source is turned off at or before the start of on-press laser exposure (more preferably before mounting the plate on press), and the white light source is turned on (with or without the yellow-red light source being turned off, preferably with the yellow-red light source being turned off) at the end of or during on-press development or during lithographic printing, more preferably around the end of on-press development.

In a ninth preferred embodiment of this invention, there are one or more presses and one or more exposure devices in a pressroom; and the light sources are controlled at least from (i) the exposure devices each of which is capable of automatically turning off the white light source, if it is on, and turning on the yellow-red light source, if it is off, after setting up and until at least completing a laser exposure job; and (ii) the presses each of which is capable of automatically turning on the white light source after starting the press for 1 to 600 rotations of the plate cylinder or for 1 to 600 seconds; wherein if any of the exposure devices has a job in the queue, is exposing a plate, or has an exposed plate on it waiting to be removed, the light switching function (to turn on the white light) of the presses will postpone until the exposure device finishes the job and the exposed plate on the exposure device has been removed for 0 to 600 seconds.

In a tenth preferred embodiment of this invention, the plate can be imagewise exposed with a Laser on a press, developed with ink and/or fountain solution on the same press, and then lithographically prints inked images to the receiving medium (such as paper); wherein the press is shielded with covers to block off substantially all of the room light or of the below-450 nm portion of the room light from reaching the plate mounted on said press during at least a portion (preferably substantially all) of the on-press exposure and development, and at least a part of said covers is opened during at least a portion (preferably substantially all) of the lithographic printing. The plate can be mounted onto the press for laser exposure, on-press development and lithographic printing, manually or automatically, preferably automatically from a substantially light-tight cassette or cartridge.

In an eleventh preferred embodiment of this invention, the plate is exposed with a laser while mounted on a lithographic press, and said press is connected to a light-tight cassette for feeding the plate to automatically mount to said press for said imagewise exposure, on-press development, and lithographic printing; said press is in a pressroom having a yellow-red light source and a white light source; the yellow-red light source is on and the white light source is off during at least a portion (in terms of time) of the imagewise exposure (step b) and on-press development (step c), and the white light source is on (with the yellow-red light source off or on, preferably off) during at least a portion of the lithographic printing (step d). Preferably, the yellow-red light source is on and the white light source is off during at least 90%, more preferably at least 99%, and most preferably all of steps (b) and (c), and the white light source is on during at least 90%, more preferably at least 99%, and most preferably all of step (d). Further preferably, the yellow-red light source is turned on and the white light source is turned off before mounting the plate on press (a step before step b), and the white light source is then turned on (with or without the yellow-red light source being turned off) around the end of on-press development (step c).

In a twelfth preferred embodiment of this invention, the plate is exposed on a laser imager; said imager is connected to a plate cassette for feeding the plate to the imager and is also connected to a plate collector for collecting the exposed plate; said imager, cassette and collector are shielded with covers so that no or substantially no room light or the below-450 nm portion of the room light reaches the plate while the plate is in the cassette, imager or collector, or during the transportation between cassette, imager or collector; and the exposed plate is picked up from the collector to mount to a lithographic press for on-press development and lithographic printing. Here said imager and press are in a pressroom having a yellow-red light source and a white light source; said yellow-red light source is on and said white light source is off in said pressroom when a portion of said covers is opened, when the exposed plate is picked up from the collector to mount to said press, or during at least a portion (preferably at least 90%, more preferably at least 99%, most preferably all, by time) of said on-press development; and said white light source is on (with the yellow light source off or on) during at least a portion (preferably at least 90%, more preferably at least 99%, most preferably all, by time) of said lithographic printing.

In a thirteenth preferred embodiment of this invention, the plate is exposed on a laser imager in an imager room, the exposed plate is placed in a light-tight box to transport to a pressroom, and the exposed plate is then picked up from said box to mount to a lithographic press for on-press development and lithographic printing. Here said imager is in a room (imager room) having a yellow-red light source (with or without a white light source), and said press is in another room (pressroom) having a yellow-red light source and a white light source; said yellow-red light source in said pressroom is on and said white light source in said pressroom is off when the plate is picked up from said box to mount to said press, or during at least a portion (preferably at least 90%, more preferably at least 99%, most preferably all, by time) of said on-press development; and said white light source in said pressroom is on (with the yellow light off or on) during at least a portion (preferably at least 90%, more preferably at least 99%, most preferably all, by time) of the lithographic printing. The light-tight box can be the plate collector of the imager which can be detached from the imager; alternatively, the light-tight box can be a separate light-tight box where the exposed plate is transferred from the plate collector to the light-tight box, preferably under yellow-red light.

In a fourteenth preferred embodiment of this invention, the plate is exposed on a laser imager in an imager room, the exposed plate is transferred (preferably automatically) through a light-tight passage from the imager room into a light-tight box which is located fully or partially in a pressroom, and the exposed plate is then picked up from the box in the pressroom to mount to a lithographic press for on-press development and lithographic printing. Here said imager is in a room (imager room) having a yellow-red light source (with or without a white light source), and said press is in another room (pressroom) having a yellow-red light source and a white light source; said yellow-red light source in said pressroom is on and said white light source in said pressroom is off when the plate is picked up from the box to mount to said press and during at least a portion (preferably at least 90%, more preferably at least 99%, most preferably all, by time) of said on-press development; and said white light source in said pressroom is on (with the yellow light source off or on) during at least a portion (preferably at least 90%, more preferably at least 99%, most preferably all, by time) of the lithographic printing.

In a fifteenth preferred embodiment of this invention, at least a portion preferably at least 90%, more preferably at least 99% and most preferably all) of said on-press development (step c) is performed with the plate under a first light that is incapable of causing hardening of the photosensitive layer or background toning of the substrate in the non-hardened areas of the plate during the time period of said step (c) (preferably within 60 minutes and more preferably within 30 minutes); and at least a portion (preferably at least 90%, more preferably at least 99% and most preferably all) of said lithographic printing (step d) is performed with the plate under a second light that is capable of causing hardening of the photosensitive layer or background toning of the substrate in the non-hardened areas of the plate before development (preferably within 60 minutes and more preferably within 30 minutes); said first light and second light being different in intensity and/or wavelength range. Preferably, the first light is a yellow-red light, or a weaker white light (with intensity lower than the second white light), more preferably a yellow-red light; and the second light is a white light. The press can be in a pressroom having a light switch or a controlling system capable of switching between the first light and the second light; the room light is preferably switched from the first light to the second light around the end of the step (c) or around the beginning of the step (d), preferably around the end of step (c).

In a sixteenth preferred embodiment of this invention, at least a portion (preferably at least 90%, more preferably at least 99% and most preferably all, in terms of time) of said lithographic printing (step d) is performed with the plate under a white light; and at least a portion (preferably at least 90%, more preferably at least 99% and most preferably all) of said on-press development (step c) is performed with the plate under a white light having an intensity that is lower than (preferably less than 50% of and more preferably less than 10% of) said white light of step (d), wherein said white light at said intensity for step (c) does not cause hardening of the photosensitive layer or background toning of the substrate in the non-hardened areas during said step (c). Preferably, the white light at the intensity for said step (d) is capable of causing hardening of the photosensitive layer or background toning of the substrate in the non-hardened areas of the plate before development within 60 minutes, preferably within 30 minutes. The press can be in a pressroom having a light switch or a controlling system capable of switching between a weak white room light and a normal white room light; the light is preferably switched from a weaker white light to a regular white light around the end of the on-press development (step c) or the beginning of the lithographic printing (step d). Alternatively, said steps (c) and (d) are performed in a pressroom having one or more white light sources capable of being adjusted or switched to different intensities for the room, said light sources are on a first intensity during at least a portion (preferably at least 90%, more preferably substantially all) of said step (c), and then adjusted or switched to a higher (preferably at least twice and more preferably at least 10 times) of said first intensity around the end of said step (c) and remain on such higher intensity during at least a portion (preferably at least 90% and more preferably substantially all) of said step (d); preferably, the light during step (d) is at a typical working intensity for pressroom, and the first intensity is lower than a typical working intensity for pressroom. Further alternatively, one or more white light sources can be turned on for said on-press development, and additional one or more white light sources can then be turned on around the end of step (c) or around the beginning of step (d), preferably around the end of step (c).

The plates can be packaged in a substantially light-tight (or yellow-red light passing only) cassette (preferably light-tight cassette). The cassette can be connected to the laser exposure device with substantially light-tight (or yellow-red light passing only) covers (preferably light-tight covers) for the plate being exposed. The plate can be automatically transferred to the exposure device for laser exposure. The exposed plate can be transferred to the press for on-press development manually under yellow-red light or a weaker white light, or automatically under yellow-red light or in substantial darkness. The plate cassette can be any design which can hold one or more plates and can feed out one plate at a time. A light-tight cassette has non-transparent covers to prevent the room light from reaching the plate within the cassette.

For plate imaged on a laser imager off press, the imager is preferably connected to a plate cassette for feeding the plate to the imager for imaging and also connected to a plate collector for collecting the imaged plate; more preferably, the imager, cassette, and collector are shielded with covers which prevent all or substantially all of the room light or the below-450 nm portion of the room light (most preferably all or substantially all room light) from reaching the plate while in the cassette, imager, or collector. Certain parts of the covers can be opened to allow loading additional plates to the cassette, picking up one or more imaged plates from the collector, or checking the imager under yellow-red lighting (preferably in a room with the yellow-red light source on without any white light source on).

For on-press exposure and development, the plate can be exposed on press before mounting on the plate cylinder (such as exposed with a flatbed laser scanner installed on press), or can be exposed while mounted on the plate cylinder, preferably exposed while mounted on the plate cylinder. The plate on the press can be open to the room lighting that is a yellow-red light, a weaker white light, or substantial darkness. Preferably, the press is shielded with covers that prevent substantially all of the radiation below a wavelength selected from 400 to 650 nm from reaching the plate mounted on the press during laser exposure and/or on-press development. The plate can be loaded manually under a yellow-red room light or a weaker white light. Preferably, the plate is automatically loaded onto the press for on-press exposure and development from a substantially light-tight cassette, under white room lighting. After on-press development, a portion of the covers on the press can be opened so that the plate can be viewed under white light during printing.

When the plate is handled, imagewise exposed, and/or on-press developed with ink and/or fountain solution under a yellow-red light, a weaker white light or in substantial darkness (but not complete darkness), the operator can wear a pair of night vision goggles or other vision enhancing device so that he or she can see things more clearly without the requirement of full white light.

Preferably, shortly before a room light is switched to another room light, especially shortly before a safe light (such as a yellow-red light) is switched to an unsafe light (such as a white light), a sound or visible light warning system can send out signals to warn the personnel in the pressroom that the room light will be switched to a different mode. The warning system can be certain sound signals (such as alarm or verbal announcement) or visible light signal (such as a flashing red light), or both. Preferably, the signal is sent out within 20 minutes before, more preferably within 5 minutes before, and most preferably within 2 minute before the room light is switched to a different mode. The signal can be sent out once, more than once, or continuously, between the start of the signals and the switching of the light mode; preferably, the signal is sent out more than once between the start of the signals and the switching of the light mode. For example, the warning system can give the $1^{st}$ signal at 3 minutes before the switching of the light mode (such as by sounding an alarm and then announcing with a loudspeaker that "the room light will switch to white light in 3 minutes"), give the $2^{nd}$ signal at 2 minutes before the switching of the light mode (such as by announcing "the room light will switch to white light in 2 minutes"), give the $3^{rd}$ signal at 1 minute before the switching of the light mode (such as by announcing "the room light will switch to white light in 1 minute"), give the $4^{th}$ signal at 30 seconds before the switching of the light mode (such as by announcing "the room light will switch to white light in 30 seconds"), and give the $5^{th}$ signal at 15 seconds before and until the switching of the light mode (such as by announcing "15 seconds to switch to white light," "10 seconds to switch to white room light," "5 seconds to switch to white room light," and "switch to white light now").

For off-press laser exposure, the exposed plate can be heated to 50 to 200° C. for 1 to 600 seconds, preferably 70 to 150° C. for 1 to 300 seconds and more preferably 90 to 130° C. for 1 to 60 seconds, to further harden the photosensitive layer in the exposed areas without causing hardening in the non-exposed areas before mounting on press for development with ink and/or fountain solution. The plate is preferably under a yellow-red light, under a lighting that contains substantially no radiation below a wavelength selected from 400 to 650 nm, or in substantial darkness during at least a portion (in terms of time), preferably substantially all and more preferably all, of such heat treatment.

For off-press laser exposure of a plate having a water soluble or dispersible overcoat, the exposed plate can be rinsed with water or an aqueous solution to remove the overcoat without developing the photosensitive layer before mounting on press for development with ink and/or fountain solution. The plate is preferably under a yellow-red light, under a lighting that contains substantially no radiation below a wavelength selected from 400 to 650 μm, or in substantial darkness during at least a portion (in terms of time), preferably substantially all and more preferably all, of such water rinse.

The lithographic printing plate suitable for the instant invention comprises on a substrate a photosensitive layer; wherein said photosensitive layer is soluble or dispersible in ink (for waterless plate) or in ink and/or fountain solution (for wet plate) and capable of hardening upon exposure to a laser, and at least the hardened areas of said photosensitive layer exhibits an affinity or aversion substantially opposite to the affinity or aversion of said substrate to at least one printing liquid selected from the group consisting of ink and an abhesive fluid for ink. Here, the photosensitive layer can have the same affinity or aversion as the substrate and change to opposite affinity or aversion upon laser exposure, with or without further treatment such as contacting with ink and/or fountain solution, (with phase change); or can have opposite affinity or aversion to the substrate both before and after laser exposure (no phase change). Preferably, said photosensitive layer exhibits an affinity or aversion substantially opposite to the affinity or aversion of said substrate (no phase change, including waterless plate and wet plate). More preferably, said photosensitive layer is oleophilic (and hydrophobic) and said substrate is hydrophilic (wet plate). An abhesive fluid for ink is a fluid that repels ink; fountain solution is the most commonly used abhesive fluid for ink. An ink and/or fountain solution soluble or dispersible overcoat can be further coated on said photosensitive layer.

Usually, as for most printing plates described in the literature, the photosensitive layer exhibits an affinity or aversion substantially opposite to the affinity or aversion of the substrate to at least one printing liquid selected from the group consisting of ink and an abhesive fluid for ink (fountain solution is a preferred abhesive fluid for ink), and does not switch its affinity or aversion upon laser exposure. However, certain photosensitive layer exhibits substantially the same affinity or aversion as the substrate and is capable of switching to opposite affinity or aversion upon exposure to an actinic radiation (with or without further treatment such as on-press development), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly suitable hydrophilic substrate for a wet lithographic plate is an aluminum support that has been grained and anodized; such a substrate is preferably further deposited with a hydrophilic barrier layer. Surface (also called roughening) can be achieved by mechanical graining or brushing, chemical etching, and/or electrochemical graining; preferably by electrochemical graining. The roughened surface is preferably further anodized to form a durable aluminum oxide surface using an acid electrolyte such as sulfuric acid and/or phosphoric acid. The roughened and anodized aluminum surface is preferably further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method, preferably by thermal method. By thermal method, the gained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205. The aluminum substrate preferably has an average surface roughness Ra of from 0.1 to 1.0 μm, more preferably from 0.2 to 0.6 μm, and most preferably from 0.3 to 0.5 μm.

For preparing lithographic printing plates of the current invention, any photosensitive layer is suitable which is capable of hardening upon exposure to a laser having a wavelength selected from 200 to 1200 nm, and is soluble or dispersible in ink and/or fountain solution. Here hardening means becoming insoluble and non-dispersible in ink and/or fountain solution. In this invention, hardening can be achieved through any means, including chemical reactions (such as polymerization, crosslinking, and chemical changes of monomer, polymer or compound) and physical changes (such as coalescence of polymer particles). Preferably, hardening is achieved through chemical reaction (such as polymerization, crosslinking, or chemical change). More preferably, hardening is achieved through crosslinking or polymerization of the resins (polymers and/or monomers). Most preferably, hardening is achieved through polymerization of the monomers. A laser sensitive dye or pigment is usually used in the photosensitive layer. The photosensitive layer preferably has a coverage of from 100 to 3000 mg/m$^2$, more preferably from 300 to 2000 mg/m², and more preferably from 500 to 1500 mg/m².

Photosensitive layers suitable for the current invention may be formulated from various photosensitive materials, usually with addition of a sensitizing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

In this application, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term "comprises a . . . " means "comprises at least one . . . "; for example, the term "comprising a monomer" means "comprising at least one monomer."

Photosensitive materials useful in wet plates of this invention include, for example, photosensitive compositions comprising a polymerizable monomer, an initiator, a sensitizing dye, and optionally a polymer.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (thermosensitive) materials useful for wet lithographic plates of this invention include, for example, thermosensitive compositions comprising a polymerizable monomer, an initiator, an infrared light absorbing dye, and optionally a polymer. Also useful thermosensitive materials are infrared sensitive compositions comprising a crosslinkable polymer and an infrared absorbing dye or pigment. Further useful thermosensitive materials are infrared sensitive compositions comprising a polymer or compound capable of becoming insoluble upon heat and an infrared absorbing dye or pigment. Yet further useful thermosensitive materials are infrared sensitive compositions comprising a polymeric particulate dispersion and an infrared absorbing dye or pigment.

Visible (including violet) laser sensitive materials useful for wet plates of this invention include, for example, photosensitive compositions comprising a polymerizable monomer, an initiator, a visible light sensitizing dye, and optionally a polymer. Also useful visible laser sensitive materials are photosensitive materials comprising a crosslinkable or polymerizable polymeric binder and a visible laser sensitizing dye, preferably with addition of an initiator.

Violet or ultraviolet laser sensitive materials useful as photosensitive layer of this invention include, for example, photosensitive compositions comprising a polymerizable monomer, an initiator, a violet or ultraviolet sensitizing dye, and optionally a polymeric binder; a hydrogen donor is preferably added to accelerate the polymerization. Also useful violet or ultraviolet laser sensitive materials are photosensitive materials comprising a crosslinkable or polymerizable polymeric binder and a violet or ultraviolet laser sensitizing dye, preferably with addition of an initiator.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, polymeric binder having acetoacetate groups (such as the acetoacetylated polymers as described in U.S. Pat. Nos. 6,919,416 and 7,001,958), and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; oligomeric amine (meth)acrylate; and phosphate ester-containing (meth)acrylate (such as phosphate ester of 2-hydroxyethyl methacrylate, and various phosphate ester containing (meth)acrylate monomers as described in U.S. Pat. Nos. 4,101,326, 5,679,485, 5,776,655 and 7,316,887, and U.S. Pat. App. No. 2008/0008957). The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (meth)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane)tetra(meth)acrylate. Among the non-urethane (meth)acrylate monomers, non-urethane acrylate monomer is preferred.

The free radical initiators useful for the photosensitive layer of this invention include any initiators capable of generating free radicals or other activating species to cause polymerization of the monomers upon exposure to a laser having a wavelength selected from 200 to 1200 µm, with or without the presence of a sensitizing dye Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl) borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2,2',4-tris(2-chlorophenyl)-5-(3,4-dimethoxyphenyl)-4',5'-diphenyl-1,1'-biimidazole, and 2-(1-naphthyl)-4,5-diphenyl-1,2'-biimidazole; and titanocene compounds such as bis($\eta^9$-2,4-cyclopentadien-1-yl)bis[2,6-difluoro-3-(1H-pyrrol-1-yl) phenyl)titanium. For thermosensitive plate, onium salts, borate salts, and s-triazines are preferred free radical initiators; onium salts and borate salts are more preferred; and onium salts (particularly diaryliodonium salts and triarylsulfonium salts) are most preferred. For violet or ultraviolet plate, hexaarylbiimidazole compounds and titanocene compounds are preferred free radical initiators, and hexaarylbiimidazole compounds are more preferred. One or more initiators can be added in a photosensitive layer. The initiator is added in the photosensitive layer preferably at 0.5 to 40% by weight of the photosensitive layer, more preferably at 2 to 30%, and most preferably at 5 to 20%.

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol A/epichlorohydrin epoxy resin and multifunctional epichlorohydrin/tetraphenylol ethane epoxy resin.

Suitable cationic initiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Suitable sensitizing dyes in this invention include any compounds capable of absorbing an imaging radiation and transferring the absorbed radiation energy to the initiator or other component in the photosensitive layer to cause hardening of the photosensitive layer. Suitable sensitizing dyes include infrared sensitizing dyes (also called infrared absorbing dyes), visible sensitizing dyes (including violet sensitizing dyes), and ultraviolet sensitizing dyes. Preferred are infrared absorbing dyes and violet or ultraviolet sensitizing dyes. More preferred are infrared laser absorbing dyes and violet or ultraviolet laser sensitizing dyes.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922, 502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because infrared absorbing dye usually has higher absorbing efficiency, gives less visible color, and allows molecular level charge or energy transfer to activate the initiator. The infrared dye or pigment is added in the thermosensitive layer preferably at 0.01 to 20% by weight of the thermosensitive layer, more preferably at 0.1 to 10%, and most preferably at 0.5 to 5%.

Visible or ultraviolet sensitizing dyes useful in the visible or ultraviolet sensitive photosensitive layer of this invention include any dyes having a wavelength maximum of from 200 to 600 nm and capable of directly or indirectly causing polymerization of the monomers upon exposure to the corresponding laser. Usually, the visible or ultraviolet dye activates an initiator to cause the polymerization of the monomer upon exposure to a laser. Suitable visible and ultraviolet sensitive dyes include, for example, cyanine dyes (including polymethine dyes); rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, diethylaminophenyl)pyridine, 2-(p-dimethylaminophenyl)quinoline, 2-p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Diallylobenzene compounds and bis (dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet sensitizing dye is added in the photosensitive layer preferably at 0.1 to 20% by weight of the photosensitive layer, more preferably 0.5 to 15%, and most preferably 1 to 10%.

The photosensitive layer of the present invention may contain one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are mercapto compounds (more preferably 2-mercaptobenzothiazole, 2-mercaptobenzimidazole, 2-mercaptobenzoxazole, and 3-mercapto-1,2,4-triazole) and N-aryl-α-amino acids and their derivatives (more preferably N-phenylglycine, N-phenylglycine ethyl ester, and N-phenylglycine benzyl ester), most preferred hydrogen donors are mercapto compounds. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 10%.

A hydrophilic or oleophilic micro particles can be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particular dispersion is described in U.S. Pat. No. 6,071,675, the entire disclosure of which is hereby incorporated by reference.

For plates with rough and/or porous surface, a thin releasable interlayer can be deposited between the substrate and the photosensitive layer. Preferably, the substrate surface is rough and/or porous enough and the interlayer is tin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 mg/m², more preferably 2 to 100 mg/m², and most preferably 4 to 40 mg/m². The substrate preferably has an average surface roughness Ra of 0.2 to 2.0 microns, and more preferably 0.4 to 1.0 microns.

The photosensitive layer can be conformally coated onto a roughened substrate (for example, with Ra of larger than 0.4 microns) at thin coverage (for example, of less than 1.2 g/m²) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

An ink and/or fountain solution soluble or dispersible overcoat can be coated on the photosensitive layer for the plate of this invention to, for example, improve the photospeed, surface durability, and/or on-press developability. Particularly preferred overcoat is a water soluble or dispersible overcoat. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) can also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 3.0 g/m², more preferably from 0.005 to 1.0 g/m², and most preferably from 0.01 to 0.15 g/m².

A preferred thermosensitive lithographic plate of this invention comprises on a substrate a thermosensitive layer comprising a polymeric binder, a free radical polymerizable monomer having at least one terminal ethylenic group, a free-radical initiator, and an infrared absorbing dye. A nonionic surfactant is preferably added in the thermosensitive layer. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

Another preferred thermosensitive lithographic plate of this invention comprises on a substrate a thermosensitive layer comprising a polymeric binder, a urethane monomer having at least 3 (meth)acrylate groups, a non-urethane monomer having at least 3 (meth)acrylate groups, a free-radical initiator, and an infrared absorbing dye. Preferably, the urethane monomer has at least 4 (meth)acrylate groups, and the non-urethane monomer has at least 4 (meth)acrylate groups. More preferably, the urethane monomer has at least 6 (meth)acrylate groups. A nonionic surfactant is preferably added. One or more other monomers can be added in the photosensitive layer. The weight ratio of all the urethane (meth)acrylate monomer to all the non-urethane (meth)acrylate monomer is preferably from 0.10 to 10.0, more preferably 0.30 to 1.0. An ink and/or fountain solution soluble or dispersible overcoat is preferably coated on the photosensitive layer.

A third preferred thermosensitive lithographic plate of this invention comprises on a substrate a thermosensitive layer comprising a polymeric binder having polymer backbone with recurring units having pendant poly(alkylene glycol) side chains, a (meth)acrylate monomer having at least one (meth)acrylate group, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0. An ink and/or fountain solution soluble or dispersible overcoat is preferably coated on the photosensitive layer.

A fourth preferred thermosensitive lithographic plate of this invention comprises on a substrate a thermosensitive layer comprising a polymeric binder, a urethane (meth)acrylate monomer having at least 4 (meth)acrylate groups, a phosphate ester-containing (meth)acrylate monomer, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0. An ink and/or fountain solution soluble or dispersible overcoat is preferably coated on the photosensitive layer.

A fifth preferred thermosensitive lithographic plate of this invention comprises on a substrate a thermosensitive layer comprising an epoxy or vinyl ether monomer having at least one epoxy or vinyl ether group, a Bronsted acid generator capable of generating free acid in the presence of an infrared absorbing dye or pigment upon exposure to an infrared radiation, and an infrared absorbing dye or pigment (preferably infrared absorbing dye). A polymeric binder is preferably added. Other additives such as surfactant, dye or pigment, exposure-indicating dye, and acid quencher (usually an alkaline compound, such as tetrabutylammonium hydroxide or triethylamine) may be added.

A sixth preferred thermosensitive lithographic plate of this invention comprises on a substrate a thermosensitive layer comprising a polymeric binder and an infrared absorbing dye or pigment (preferably infrared absorbing dye); said thermosensitive layer is developable with ink and/or fountain solution and capable of hardening through crosslinking of the polymeric binder upon exposure to an infrared laser. A nonionic surfactant and/or a water-soluble polymer are preferably added in the thermosensitive layer. Other additives such as other surfactant, dye or pigment, and exposure indicating dye can also be added.

A seventh preferred thermosensitive lithographic plate of this invention comprises on a substrate a thermosensitive layer comprising a polymeric particles dispersion and an infrared absorbing dye or pigment (preferably infrared absorbing dye); said thermosensitive layer is developable with ink and/or fountain solution and capable of hardening through coalescence of the polymer particles upon exposure to an infrared laser. A nonionic surfactant and/or a water-soluble polymer are preferably added in the thermosensitive layer. Other additives such as other surfactant, dye or pigment, and exposure indicating dye can also be added.

A preferred visible light sensitive lithographic printing plate of this invention comprises on a substrate a photosensitive layer comprising a polymeric binder (with or without ethylenic groups), a free radical polymerizable monomer having at least one terminal ethylenic group, a free-radical initiator, and a visible sensitizing dye. A nonionic surfactant is preferably added in the photosensitive layer. Other additives such as surfactant, dye or pigment, exposure-indicating dye, and free-radical stabilizer may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

A preferred violet or ultraviolet light sensitive lithographic plate of this invention comprises on a substrate a photosensitive layer comprising a polymeric binder, a free radical polymerizable monomer having at least one terminal ethylenic group, a free-radical initiator, and a violet or ultraviolet sensitizing dye. A hydrogen donor is preferably added to increase the photospeed; a preferred hydrogen donor is a mercapto group-containing compound. A nonionic surfactant is preferably added to enhance on-press developability. Other additives such as surfactant, dye or pigment, exposure-indicating dye, and free-radical stabilizer may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

Another preferred violet or ultraviolet laser sensitive lithographic plate of this invention comprises on a substrate a photosensitive layer comprising a polymeric binder, a monomer having at least 3 (meth)acrylate group, a hexaarylbiimidazole or titanocene compound, a dialkylaminobenzophenone compound, and a hydrogen donor. A hexaarylbiimidazole compound is preferred among hexaarylbiimidazole and titanocene compounds. A preferred dialkylaminobenzophenone compound is a 4,4'-bis(dialkylamino)benzophenone compound. A preferred hydrogen donor is a mercapto group-containing compound. Said monomer is preferably a urethane (meth)acrylate monomer. More preferably, said monomer is a urethane (meth)acrylate monomer and said photosensitive layer further comprises a non-urethane (meth)acrylate monomer. Even more preferably, said photosensitive layer comprises a urethane monomer with at least 3 (meth)acrylate groups and a non-urethane monomer with at least 3 (meth)acrylate groups. Most preferably, said photosensitive layer comprises a urethane monomer with at least 4 (meth)acrylate groups and a non-urethane monomer with at least 4 (meth)acrylate groups. A nonionic surfactant is preferably added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

A third preferred violet or ultraviolet laser sensitive lithographic plate of this invention comprises on a substrate a photosensitive layer comprising a polymeric binder, a urethane monomer having at least 4 (meth)acrylate groups, a hexaarylbiimidazole or titanocene compound, and a dialkylaminobenzophenone compound. A mercapto group-containing compound is preferably added. The weight ratio of all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer is preferably added. An ink and/or fountain solution soluble or dispersible overcoat is preferably coated on the photosensitive layer.

A fourth preferred violet or ultraviolet laser sensitive lithographic plate of this invention comprises on a substrate a photosensitive layer comprising a polymeric binder, a urethane monomer having at least 4 (meth)acrylate groups, a non-urethane monomer having at least 4 (meth)acrylate groups, a free radical initiator, and a violet or ultraviolet sensitizing dye. A mercapto group-containing compound is preferably added. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound. An ink and/or fountain solution soluble or dispersible overcoat is preferably coated on the photosensitive layer.

A fifth preferred violet or ultraviolet laser sensitive lithographic plate of this invention comprises on a substrate a photosensitive layer comprising a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A mercapto group-containing compound is preferably added. Other additives such as surfactant, dye or pigment, exposure-indicating dye, and free-radical stabilizer may be added. The weight ratio of all the monomers to all the polymeric binders is preferably at least 1.0, more preferably from 1.5 to 6.0, and most preferably from 2.0 to 5.0. An ink and/or fountain solution soluble or dispersible overcoat is preferably coated on the photosensitive layer.

A sixth preferred violet or ultraviolet laser sensitive lithographic plate of this invention comprises on a substrate a photosensitive layer comprising a polymeric binder, a urethane monomer having at least 4 (meth)acrylate groups, a phosphate ester-containing (meth)acrylate monomer, a free radical initiator, and a violet or ultraviolet sensitizing dye. A mercapto group-containing compound is preferably added. The weight ratio of all the monomers to all the polymeric binders is preferably at least 0.5, more preferably from 1.0 to 6.0, and most preferably from 2.0 to 5.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound. A phosphate-free non-urethane (meth)acrylate monomer can be added. An ink and/or fountain solution soluble or dispersible overcoat is preferably coated on the photosensitive layer.

As for all the photosensitive layer of this invention, the above photosensitive layers (including thermosensitive layers) are soluble or dispersible in ink and/or fountain solution, so that the plates having such photosensitive layers can be on-press developed with ink and/or fountain solution.

On-press developable lithographic plates and photosensitive layers as described in U.S. Pat. Nos. 6,482,571, 6,576,401, 5,548,222, 6,541,183, 6,551,757, 6,899,994 and 6,949,327, and U.S. patent application Ser. Nos. 11/057,663, 11/175,518, 11/266,817, 11/336,132, 11,356,911, 11/645,376, 12/127,806, and 12/126,899, the entire disclosures of which are hereby incorporated by reference, can be used for the instant invention.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 500 $mJ/cm^2$, and most preferably from 20 to 200 $mJ/cm^2$, depending on the sensitivity of the thermosensitive layer.

Visible lasers (including violet laser) useful for the imagewise exposure of the visible light sensitive plates of this invention include any laser emitting in the wavelength range of from 390 to 600 nm. Examples of suitable visible lasers include frequency-doubled ND/YAG laser (about 532 nm), argon ion laser (about 488 nm), violet diode laser (about 405 nm), and visible LEDs. Violet laser diode is especially useful because of its small size and relatively low cost. The exposure dosage is preferably from 1 to 2000 $\mu J/cm^2$ (0.001 to 2 $mJ/cm^2$), more preferably from 5 to 500 $\mu J/cm^2$, and most preferably from 20 to 200 $\mu J/cm^2$, depending on the sensitivity of the photosensitive layer.

Violet or ultraviolet lasers useful for the imagewise exposure of the plates of this invention include any lasers having a wavelength of from 200 to 430 nm, such as violet laser diodes having a wavelength of from 390 to 430 nm, and ultraviolet laser diodes or LEDs having a wavelength of from 200 to 390 nm. Laser diodes are preferred violet or ultraviolet lasers. The exposure dosage is preferably from 1 to 2000 $\mu J/cm^2$ (0.001 to 2 $\mu J/cm^2$), more preferably from 5 to 500 $\mu J/cm^2$, and most preferably from 20 to 200 $\mu J/cm^2$, depending on the sensitivity of the photosensitive layer. Violet laser with a wavelength of from 390 to 430 nm is particularly useful among violet and ultraviolet lasers.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press), and the exposed plate can be directly developed on press with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions.

It is noted that for a good quality print, the imaged areas should have good inking and the background areas should be free of ink (with clean background). Any background toning is not desirable.

The term "background toning" means that the non-imaged areas (with photosensitive layer removed from the substrate during development) of the developed plate, as well as the non-imaged areas of the printed sheets, accept small amount of ink and are not completely clean, so that the non-imaged areas of a printed paper shows slightly different color (such as slightly gray for a white paper with background toning when printed with black ink, or slightly pink for a white paper with background toning when printed with red ink). Background toning is usually caused by partial curing of the photosensitive layer, incomplete removal of the photosensitive layer during development, insufficient hydrophilicity of the substrate, or insufficient fountain solution level of the press. A plate of this invention which is originally free of background toning can become having background toning after exposure to a white or other room light for a certain amount of time due to partial curing of the photosensitive layer; further exposure to such room light may, or may not, lead to full hardening of the photosensitive layer, depending on the particular plate. In normal printing operation as well as in this application, sufficient fountain solution level on press should be maintained, so that the background toning should not be caused by insufficient fountain solution level.

It is noted that some negative plate will become having background toning after exposure to white room light for a certain amount of time (or to a yellow room light for a longer period of time for certain plate) and become fully hardened after further exposure to white light (or to a yellow room light for certain plate), some negative plate will become having background toning after exposure to white room light for a certain amount of time but will never become fully hardened with further exposure to white room light, some negative plate will become fully hardened under white room light quickly (such as under 10 minutes), and some negative plate will never become fully hardened or having background toning even after exposure to white room light for a long period of time (such as at least 24 hours). Here the term "fully hardened" means that the photosensitive layer in specific areas is sufficiently cured so that substantially the whole photosensitive layer in such areas remains on the plate after development. Preferably, the plates suitable for the instant invention are capable of hardening or background toning under a regular white room light (at typical intensity for office or pressroom lighting) for less than 120 minutes, more preferably less than 60 minutes, and most preferably less than 30 minutes.

The ink and fountain solution may be applied at any combination or sequence, as needed for the plate; there is no particular limitation. For conventional wet press, usually fountain solution is applied (to contact the plate) first, followed by contacting with ink roller; preferably, fountain solution is applied to the plate first to dampen without removing the photosensitive layer, followed by contacting with ink to remove the non-hardened areas of the photosensitive layer. For press with integrated inking/dampening system, the ink and fountain solution are emulsified by various press rollers before being transferred to the plate as emulsion of ink and fountain solution.

The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

The plate of this invention is on-press developed with ink and/or fountain solution. Preferably, the plate is a wet plate which is on-press developed with ink and/or fountain solution, or a waterless plate which is on-press developed with ink. More preferably, the plate is a wet plate which is on-press developed with ink and/or fountain solution. Most preferably, the plate is a wet plate with oleophilic photosensitive layer and hydrophilic substrate and is on-press developed with ink and fountain solution.

This invention is further illustrated by the following examples of its practice. Unless specified, all the values are by weight.

EXAMPLES 1-5

An electrochemically roughened, anodized, and polyvinylphosphonic acid treated aluminum sheet was first coated with a 0.1% aqueous solution of polyvinyl alcohol (Celvol 540, from Celanese) with a #6 Meyer rod, followed by drying in an oven at 100° C. for 2 min. The polyvinyl alcohol coated substrate was further coated with the photosensitive layer formulation PS-1 with a #8 Meyer rod, followed by drying in an oven at 90° C. for 2 min.

| PS-1 | |
|---|---|
| Component | Weight ratios |
| Neocryl B-728 (Polymer from Zeneca) | 3.193 |
| Sartomer SR-399 (Acrylic monomer from Sartomer) | 7.630 |
| Pluronic L43 (Nonionic surfactant from BASF) | 0.649 |
| 2,2-Bis(2-chlorophenyl)-4,4',5,5'-tetraphenyl-1,1'-biimidazole | 1.407 |
| 2-Mercaptobenzoxazole | 0.839 |
| 4,4'-Bis(diethylamino)benzophenone | 0.281 |
| 2-Butanone | 86.000 |

The photosensitive layer coated plate was further coated with a water-soluble overcoat OC-1 using a #6 Meyer rod, followed by drying in an oven at 100° C. for 2 min.

| OC-1 | |
|---|---|
| Component | Weight ratios |
| Airvol 205 (polyvinyl alcohol from Air Products) | 0.40 |
| Dioctyl sulfosuccinate sodium salt (surfactant) | 0.02 |
| Water | 99.58 |

The plate was exposed with a violet plate imager equipped with a 30 mw violet laser diode emitting at about 405 nm (MAKO-4 from ECRM) for a dosage of about 60 μJ/cm². The plate was imaged in a dim red light room, and was kept in a light tight box before and after imaging. The laser exposed plate was cut into five pieces, and each piece was wrapped with a separate aluminum foil. Each piece of the plate was tested on press under a different lighting condition. The first piece was tested in darkness (with all lights turned off). The second piece was tested under a 60-watt yellow light (yellow coated incandescent light, from General Electric). The third piece was tested under a 60-watt red light (red coated incandescent light, from General Electric). The fourth piece was tested under a 20-watt white office fluorescent light (from General Electric). The fifth piece was tested under a 100-watt regular incandescent light (for home use, from General Electric). Each light was about 2 meters from the top of the press. It took about 5 minutes to mount each plate and start up the press.

Each of the exposed plate pieces was unwrapped and tested on a wet lithographic press (AB Dick 360) under the above described lighting condition (including darkness). The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The printed sheets were evaluated for the on-press developability of the plates, with the results summarized in Table 1.

TABLE 1

| Pressroom lighting | Background at 20 impressions | Background at 200 impressions | Inking in imaging areas |
|---|---|---|---|
| In darkness (no light) | Clean | Clean | Good |
| Yellow light | Clean | Clean | Good |
| Red light | Clean | Clean | Good |
| White fluorescent light | Inked | Heavy toning | Good |
| Regular incandescent light | Inked | Heavy toning | Good |

EXAMPLES 6-10

An electrochemically roughened, anodized, and silicate treated aluminum sheet was coated with thermosensitive layer formulation PS-2 using a #8 Meyer rod, followed by drying in an oven at 90° C. for 2 min.

PS-2

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #6 Meyer rod, followed by drying in an oven at 100° C. for 2 min.

OC-2

| Component | Weight ratios |
|---|---|
| Airvol 205 (Polyvinyl alcohol from Air Products) | 5.00 |
| Zonyl FSO (Perfluorinated surfactant from DuPont) | 0.02 |
| Water | 95.00 |

The plate was exposed with an infrared laser plate imager equipped with laser diodes emitting at about 830 nm (Trendsetter from Creo) at a dosage of 150 mJ/cm². The plate was imaged in a dim red light room, and was kept in a light tight box before and after imaging.

The laser exposed plate was cut into five pieces, and kept in a light-tight box for all the time except for the specific exposure as indicated. The first piece was kept in darkness (in a box) all the time after exposure. The second piece was exposed to a 60-watt yellow light (yellow coated incandescent light, from General Electric) at a distance of 2 meters for 60 minutes. The third piece was exposed to a 60-watt red light (red coated incandescent light, from General Electric) at a distance of 2 meters for 60 minutes. The fourth piece was exposed to a 40-watt white office fluorescent light (from General Electric) at a distance of 2 meters for 60 minutes. The fifth piece was exposed to a 100-wan regular incandescent light (for home use, from General Electric) at a distance of 2 meters for 60 minutes.

The exposed plate pieces as treated above were tested on a wet lithographic press (AB Dick 360) under a dim red light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The printed sheets were evaluated for the on-press developability of the plates, with the results summarized in Table 2.

TABLE 2

| Room light exposure before mounting on press | Background at 20 impressions | Background at 200 impressions | Inking in imaging areas |
|---|---|---|---|
| In darkness (no exposure) | Clean | Clean | Good |
| Yellow light for 60 minutes | Clean | Clean | Good |
| Red light for 60 minutes | Clean | Clean | Good |
| White office fluorescent light for 60 mintues | Inked | Heavy toning | Good |
| Regular incandescent light for 60 minutes | Inked | Heavy toning | Good |

I claim:

1. A method of lithographically printing images on a receiving medium, comprising in order:
   (a) providing a lithographic printing plate comprising (i) a substrate, and (ii) a photosensitive layer soluble or dispersible in ink and/or fountain solution and capable of hardening upon exposure to a laser having a wavelength selected from 200 to 1200 nm;
   (b) imagewise exposing said plate with said laser to cause hardening of the photosensitive layer in the exposed areas;
   (c) developing said plate with ink and/or fountain solution on a lithographic press to remove the non-hardened areas of said photosensitive layer; and
   (d) lithographically printing images from said plate to the receiving medium;

(e) wherein at least 90% in terms of time of said on-press development (step c) is performed with the plate under a first light that does not cause hardening of the photosensitive layer in the laser-non-exposed areas within at least 30 minutes; and at least 90% in terms of time of said lithographic printing (step d) is performed with the plate under a second light that is different from the first light in intensity and/or wavelength range.

2. The method of claim 1 wherein said second light is capable of causing hardening of the non-developed photosensitive layer of said plate in the laser-non-exposed areas for less than 30 minutes.

3. The method of claim 1 wherein said first light is a white light, and said second light is another white light with intensity of at least twice of said first light.

4. The method of claim 1 wherein said first light is a white light, and said second light is another white light with intensity of at least 10 times of said first light.

5. The method of claim 1 wherein substantially the entire step (c) is performed with the plate under said first light, and substantially the entire step (d) is performed with the plate under a white light.

6. The method of claim 1 wherein said press is in a pressroom, said first light is the room light of the pressroom during at least 90% of said step (c), and said second light is the room light of the pressroom during at least 90% of said step (d).

7. The method of claim 1 wherein substantially the entire steps (b) and (c) are performed with the plate under said first light, and substantially the entire step (d) is performed with the plate under a white light.

8. The method of claim 1 wherein said steps (c) and (d) are performed in a pressroom having more than one white light sources, a limited number of said light sources are on during said step (c), additional number of said light sources are also turned on around the end of said step (c) or the beginning of said step (d), and said limited number and additional number of said light sources remain on during said step (d).

9. The method of claim 1 wherein said steps (c) and (d) are performed in a pressroom having a switch capable of switching between the first room light and the second room light, the first room light is on during substantially the entire step (c), the room light is switched from the first room light to the second room light around the end of said step (c) or the beginning of said step (d), and the second room light remains on during substantially the entire step (d).

10. The method of claim 9 wherein, within a time period selected from 1 to 20 minutes before the light is switched from the first light to the second light, a sound or visible light warning system sends out signals for one or more times to warn anyone in the pressroom that the room light will be switched to a different mode.

11. The method of claim 1 wherein said photosensitive layer comprises a free radical polymerizable monomer, a free radical initiator, and a sensitizing dye.

12. The method of claim 1 wherein said laser is a violet or ultraviolet laser having a wavelength selected from 200 to 430 nm.

13. The method of claim 1 wherein said laser is an infrared laser having a wavelength selected from 750 to 1200 nm.

14. A method of lithographically printing images on a receiving medium, comprising in order:
(a) providing a lithographic printing plate comprising (i) a hydrophilic substrate, and (ii) an oleophilic photosensitive layer soluble or dispersible in ink and/or fountain solution and capable of hardening upon exposure to a laser having a wavelength selected from 200 to 1200 nm;
(b) imagewise exposing said plate with said laser to cause hardening of the photosensitive layer in the exposed areas;
(c) developing said plate with ink and/or fountain solution on a lithographic press to remove the non-hardened areas of the photosensitive layer; and
(d) lithographically printing images from said plate to the receiving medium;
(e) wherein said steps (c) and (d) are performed in a pressroom having one or more white light sources capable of being adjusted or switched to different intensities for said pressroom, said light sources are on a first intensity during at least 90% in terms of time of said step (c), and then adjusted or switched to a higher intensity around the end of said step (c) and kept at such higher intensity during at least 90% in terms of time of said step (d).

15. The method of claim 14 wherein said laser is an infrared laser having a wavelength selected from 750 to 1200 nm.

16. The method of claim 14 wherein said light sources are on said first intensity during substantially the entire step (c), adjusted to at least twice of said first intensity around the end of said step (c) or the beginning of said step (d), and remain at such higher intensities during substantially the entire step (d).

17. The method of claim 14 wherein the plate is imagewise exposed with said laser on said press; and the room light sources are controlled at least from said press which (i) is capable of automatically adjusting or switching to the first intensity after digitally setting up a laser exposure job and (ii) is capable of automatically switching to at least twice of said first intensity after engaging the fountain roller and/or the ink roller to the plate cylinder for a certain number of rotations selected from 1 to 600 rotations of the plate cylinder.

* * * * *